US010481717B2

(12) United States Patent
Miyamoto

(10) Patent No.: US 10,481,717 B2
(45) Date of Patent: Nov. 19, 2019

(54) DISPLAY DEVICE

(71) Applicant: Japan Display Inc., Minato-ku (JP)

(72) Inventor: Mitsuhide Miyamoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/860,800

(22) Filed: Jan. 3, 2018

(65) Prior Publication Data
US 2018/0203555 A1 Jul. 19, 2018

(30) Foreign Application Priority Data

Jan. 13, 2017 (JP) ................... 2017-003846

(51) Int. Cl.
G06F 3/041 (2006.01)
G06F 3/044 (2006.01)
H01L 27/32 (2006.01)
(52) U.S. Cl.
CPC ............ *G06F 3/0412* (2013.01); *G06F 3/044* (2013.01); *H01L 27/323* (2013.01); *G06F 2203/04107* (2013.01); *G06F 2203/04111* (2013.01); *G06F 2203/04112* (2013.01); *H01L 27/3272* (2013.01)
(58) Field of Classification Search
CPC .................. G06F 3/0412; G06F 3/044; G06F 2203/04107
See application file for complete search history.

(56) References Cited

U.S. PATENT DOCUMENTS

2014/0043288 A1* 2/2014 Kurasawa ............. G06F 3/0412
345/174

FOREIGN PATENT DOCUMENTS

JP 2003-099193 4/2003

* cited by examiner

*Primary Examiner* — Lixi C Simpson
(74) *Attorney, Agent, or Firm* — Oblon, McClelland, Maier & Neustadt, L.L.P.

(57) ABSTRACT

A display device comprising: a display area, a driving circuit formed in a peripheral area, a touch sensor, overlapping the display area, having a first touch electrode extending in a first direction and a second touch electrode extending in a second direction that crosses the first direction; wherein each of the plural pixels has pixel electrode layer, the counter electrode layer over the pixel electrode layer, the display element layer formed between the pixel electrode layer and the counter electrode layer; the touch sensor is formed over the counter electrode via an insulating layer; lead wirings from the first touch electrode or from the second touch electrode extend to an area to overlap the driving circuit formed in the peripheral area; the counter electrode layer extends to cover the area that the lead wiring and the driving circuit overlap to each other in the peripheral area.

5 Claims, 17 Drawing Sheets

A—A

B—B

A—A

B—B

A—A

B—B

DISPLAY DEVICE

CLAIM OF PRIORITY

The present application claims priority from Japanese Patent Application JP 2017-003846 filed on Jan. 13, 2017, the content of which is hereby incorporated by reference into this application.

BACKGROUND OF THE INVENTION

(1) Field of the Invention

The present invention relates to a display device, especially to an organic EL display device in which the touch sensor is built in.

(2) Description of the Related Art

Since the organic EL display device is self-illuminant, viewing angle characteristics and contrast are superior to the liquid crystal display device. In addition, the organic EL display device doesn't need a back light; thus, the display device can be made thin easily. Further, a flexible organic EL display device can be realized by making the substrate by resin like e.g. polyimide.

On the other hand, the touch panel system, where input is made by touching the screen with e.g. a finger, has become common in so called smart-phones or tablet display devices. Conventionally, in the touch panel system, the touch panel having the touch sensor used to be adhered to the display device. The patent document 1 (Japanese patent laid open No. 2003-99193) discloses an organic El display device having a touch panel, which the organic El display panel and the touch panel are formed separately, and afterwards, the display panel and the touch panel are assembled, wherein the ITO (Indium Tin Oxide) for the shield is formed underneath the touch panel to prevent a mal function of the touch panel due to noises from the display panel.

The structure of the organic EL display panel of the patent document 1 discloses that a glass substrate is formed on the emitting layer and the polarizing plate is adhered to the glass substrate to suppress the reflection of external light. Afterwards, the touch panel is attached to the polarizing plate. ITO is formed on the back surface of the touch panel before the touch panel is adhered to the polarizing plate.

SUMMARY OF THE INVENTION

Herein after, the touch panel function built in in a display device is called the touch sensor. If the touch sensor is built in in the organic EL display device, it is advantageous for a thin display device; further, a flexible display device with a touch sensor can be easily realized. Further, if the touch sensor can be made in a continuous process after the organic display panel is completed, it can be a further advantage for a thin display device with a touch sensor.

On the other hand, organic EL display devices often have built in driving circuits as e.g. scanning line driving circuits, which are constituted by the TFTs (Thin Film transistors). Those driving circuits generate the noise; the touch sensor may be affected by the noise and consequently, malfunctions. This noise from the driving circuits becomes a serious problem when the touch sensor is built in or the touch sensor is formed in a continuous process with the organic EL display device. Herein after in this specification, the case when the touch sensor is formed in a continuous process with the organic EL display device is also called as that the touch sensor is built in in the organic EL display device.

The purpose of the present invention is to mitigate the influence from the driving circuits to the touch sensor when the touch sensor is built in in the organic EL display device. Further to realize such effects without adding specific processes.

The present invention solves the above problem. Concrete measures are as follows:

(1) A display device comprising: a substrate, a display area where plural pixels are formed in a matrix form on the substrate; a driving circuit formed in a peripheral area outside of the display area; a touch sensor, overlapping the display area, having a first touch electrode extending in a first direction and a second touch electrode extending in a second direction that crosses the first direction; wherein each of the plural pixels has pixel electrode layer, the counter electrode layer over the pixel electrode layer, the display element layer formed between the pixel electrode layer and the counter electrode layer; the touch sensor is formed over the counter electrode via an insulating layer; lead wirings from the first touch electrode or from the second touch electrode extend to an area to overlap the driving circuit formed in the peripheral area; the counter electrode layer extends to cover the area that the lead wiring and the driving circuit overlap to each other in the peripheral area.

(2) A display device comprising: a substrate, a display area where plural pixels are formed in a matrix form on the substrate; a driving circuit formed in a peripheral area outside of the display area; a touch sensor, overlapping the display area, having a first touch electrode extending in a first direction and a second touch electrode extending in a second direction that crosses the first direction; wherein each of the plural pixels has pixel electrode layer, the counter electrode layer over the pixel electrode layer, the display element layer formed between the pixel electrode layer and the counter electrode layer; the touch sensor is formed over the counter electrode via an insulating layer; the touch sensor has a first electrode layer formed on the first insulating layer, the second insulating layer formed on the first electrode layer; the second electrode layer formed on the second insulating layer, wherein the first touch electrode and the second touch electrode are formed on the same layer by either one of the first electrode layer or second electrode layer, the first touch electrode and the second electrode cross each other via an insulating layer formed on the same layer as the second touch insulating layer; or the first touch electrode and the second electrode are formed on a different layer to each other, and formed by either one of the first electrode layer or the second electrode layer sandwiching the second insulating layer; a lead wiring from the first touch electrode or from the second touch electrode is formed by the second electrode layer in the peripheral area and overlapping with the driving circuit; the first electrode layer extends to an area where the lead wiring and the driving circuit overlap in the peripheral area.

DETAILED DESCRIPTION OF THE PREFERRED EMBODIMENTS

The present invention will be described in detail referring to the following embodiments.

First Embodiment

Figure 1:
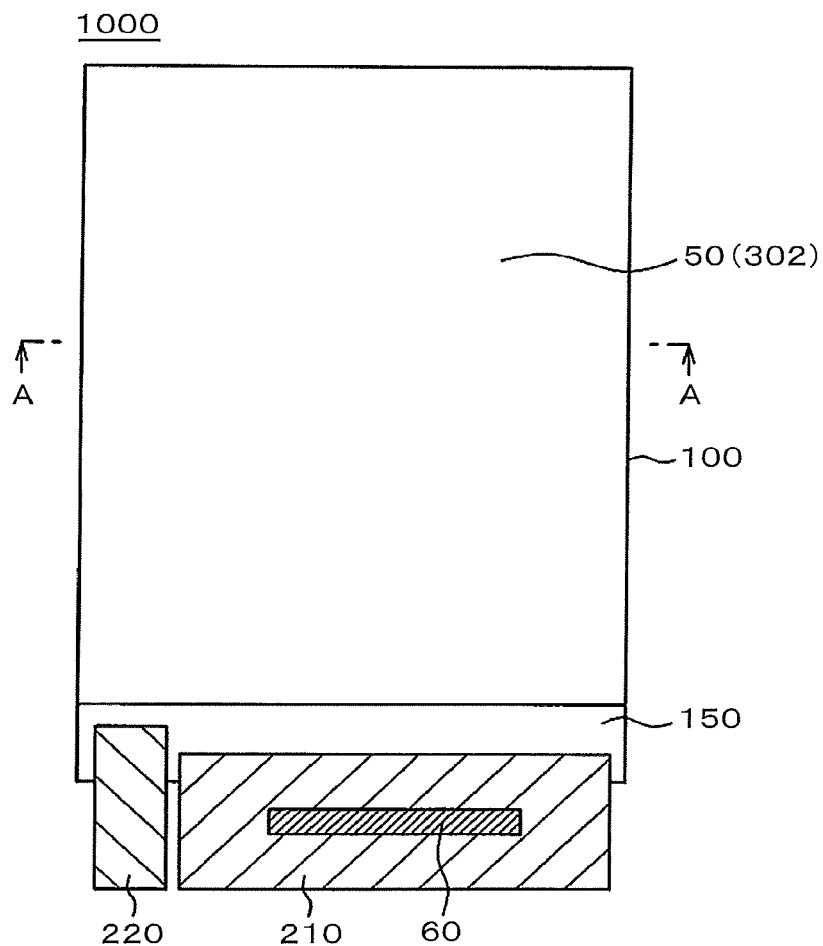
FIG. 1 is a plan view of the organic EL display device including the touch sensor according to the present invention.

FIG. 1 is a plan view of the organic EL display device 1000 including the touch sensor according to the present invention. In FIG. 1, the display area 50 and the terminal area 150 are formed on the substrate 100 of the organic EL display device. The display area is covered by the touch sensor; the cover film 302 is formed on the touch sensor for mechanical protection.

In FIG. 1, the main flexible wring substrate 210 to drive the organic EL display panel and the flexible wiring substrate 220 to drive the touch sensor are connected to the terminal area 150. The driver IC 60 to drive e.g. video signal lines of the organic EL display panel is installed on the main flexible wiring substrate 210. As may be explained later, the main wiring substrate 210 and the touch sensor flexible wiring substrate 220 are merged in one piece and be connected to the terminal area 150 as one piece.

Figure 2:
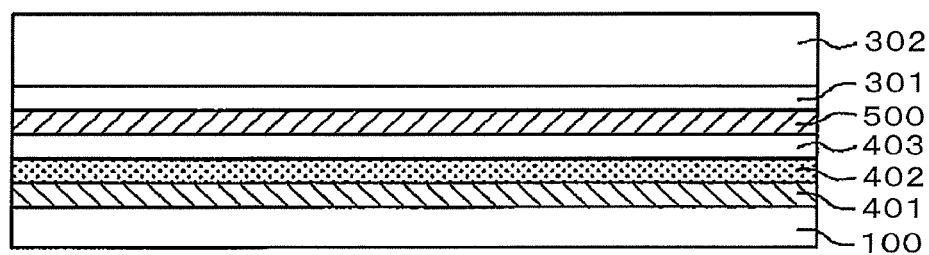
FIG. 2 is cross sectional view along the line A-A of FIG. 1.

FIG. 2 is cross sectional view along the line A-A of FIG. 1. In FIG. 2, the TFT circuit 401 is formed on the TFT substrate 100. The TFT circuit 401 is a general expression that includes selecting TFTs and driving TFTs formed in the pixels, control TFTs formed in the driving circuits, and connecting wirings, etc. The TFT circuit 401 of FIG. 2 further includes scanning lines, video signal lines and power lines.

The OLED layer 402 is formed on the TFT circuit 401. The OLED layer 402 of FIG. 2 includes the pixel electrode, the organic EL layer and the counter electrode (herein after cathode). The pixel electrode works as an anode. The organic EL layer includes plural layers as the hole injection layer, the hole transport layer, the light emitting layer, the electrode transport layer and the electrode injection layer. If the organic EL display device is a top emission type, the cathode is made by transparent electrode like a metal oxide conductive film of e.g. ITO (Indium Tin Oxide), IZO (indium Zinc Oxide); or a thin film of metal or alloy.

The sealing layer 403 is formed on the OLED layer 402 to protect the organic EL layer. The sealing layer 403 is foiled by a laminated film of the inorganic film and the organic film. The touch sensor 500 is formed on the sealing layer 403. The structure of the touch sensor 500 is explained later. The circular polarizing plate 301 is foiled on the touch sensor 500. The role of the circular polarizing plate 301 is to prevent a reflection of the external light. The cover film 302 is formed on the circular polarizing plate 301 to protect the whole display device. Although the cover film 302 is generally formed by an organic substance, the thin glass is also applicable. Glass becomes flexible and bendable when the thickness becomes 0.15 mm or less.

Figure 3:
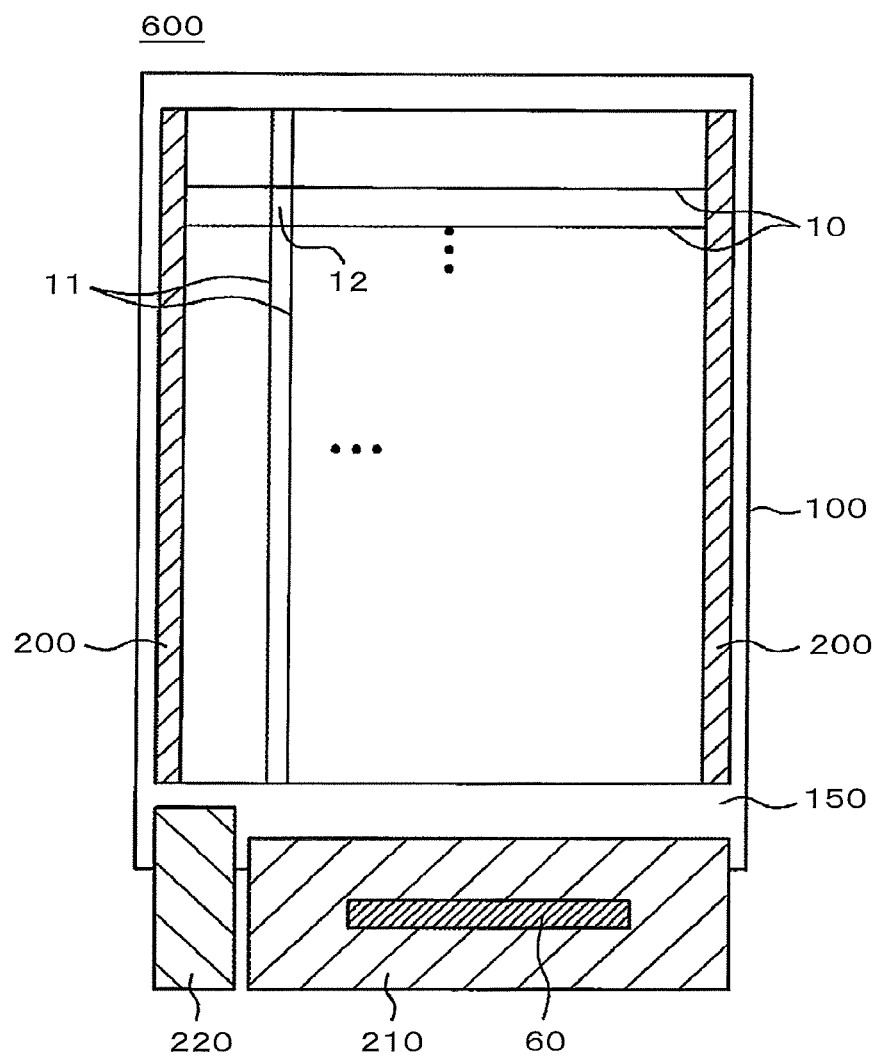
FIG. 3 is a plan view of the organic EL display panel.

FIG. 3 is a plan view of the organic EL display panel 600. By the way, in FIG. 1 and FIG. 2, the touch sensor 500 and the cover film 302 are attached on the organic EL display panel 600. In FIG. 3, the scanning lines 10 extend in lateral direction and arranged in longitudinal direction; the video signal lines 11 extend in longitudinal direction and arranged in lateral direction. The area surrounded by the scanning lines and the video signal lines is the pixel 12.

The scanning line driver circuits 200 are formed at both sides of the display area 50. The main flexible wiring substrate 210, which supplies signals and powers to the organic EL display panel 600, is connected to the terminal area 150; the driver IC 60, which drives video signal lines, is installed on the main flexible wiring substrate 210. The touch sensor flexible wiring substrate 220, which supplies signals to the touch sensor 500, is also connected to the terminal area 150.

Figure 4:
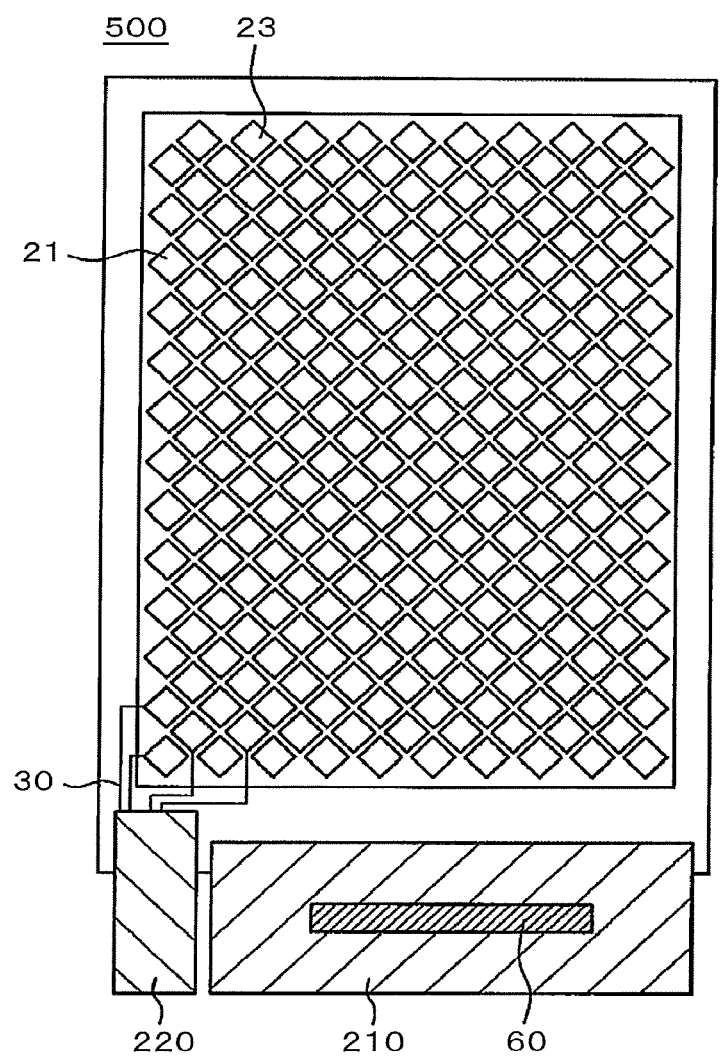
FIG. 4 is a plan view where the touch sensor is formed on the organic EL display panel.

FIG. 4 is a plan view where the touch sensor 500 is continually formed on the organic EL display panel. The touch sensor 500 is formed corresponding to the display area 50 of the organic EL display panel 600. The touch sensor 500 includes plural first touch electrodes 21, which extend in lateral direction and plural second touch electrodes 23, which extend in lateral direction.

Both the first touch electrode 21 and the second touch electrode 23 are diamond shaped and their widths are narrow at the cross area. The first touch electrode 21 and the second touch electrode 23 cross each other at the cross area via an insulating layer. Lead wirings 30 extend from the first touch electrodes 21 and the second touch electrodes 23 to the flexible wiring substrate 220. The problem is that the noise from the driving circuit 200 of the organic EL display panel 600 superimposes on the lead wirings 30; thus, the touch sensor 500 malfunctions. The purpose of the present invention is to solve this problem.

Figure 5:
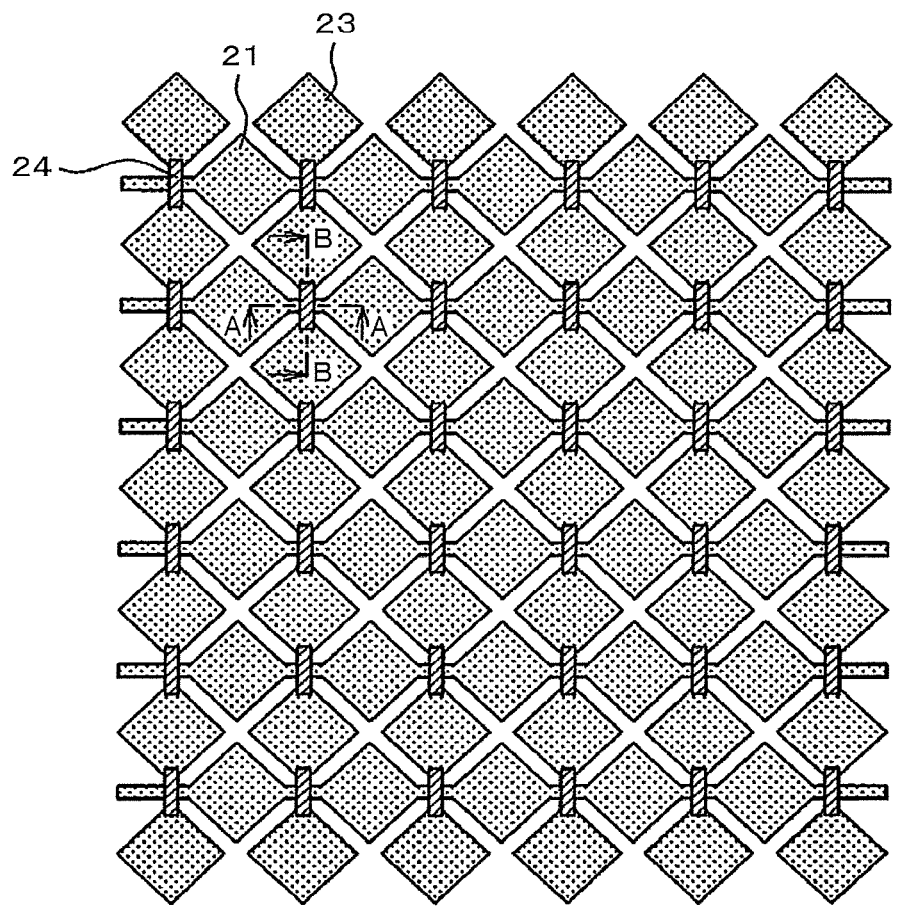
FIG. 5 is an enlarged plan view of the arrangement of the first touch electrodes and the second touch electrodes.

FIGS. 5 to 7 are detail views of the electrode structure of the touch sensor. In FIG. 5, the diamond shaped first touch electrode 21 extends in lateral direction and the diamond shaped second touch electrode 23 extends in longitudinal direction. The width of both the first touch electrode 21 and the second touch electrode 23 are narrow where they cross each other. The first touch electrode 21 is continuous, however, the second touch electrodes 23 are connected each other by the bridge electrode 24 at the cross area.

Figure 6A:
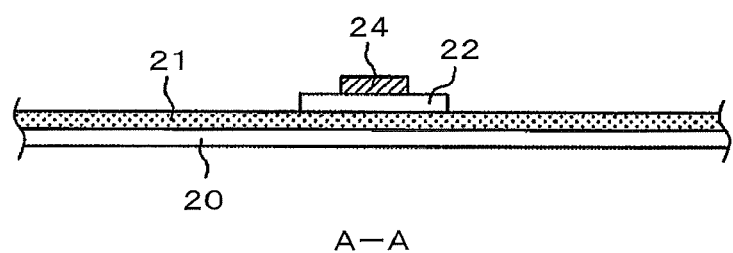
FIG. 6A is an example of cross sectional view at the cross area of the first touch electrode and the second touch electrode along the line A-A of FIG. 5.
Figure 6B:
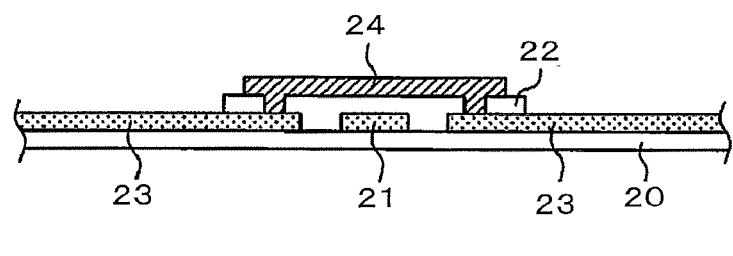
FIG. 6B is an example of cross sectional view at the cross area of the first touch electrode and the second touch electrode along the line B-B of FIG. 5.

FIGS. 6A and 6B are one example of the cross area. FIG. 6A is cross sectional view along the line A-A of FIG. 5. In FIG. 6A, the second insulating layer 22 is formed in island shape at the cross area of the first touch electrode 21 and the second touch electrode 23; the bridge electrode 24 that connects with the second touch electrodes 23 crosses with the first touch sensor 21.

FIG. 6B is cross sectional view along the line B-B of FIG. 5. In FIG. 6B, the first touch electrode 21 and the second touch electrode 23 are formed on the first insulating layer 20. At the cross area, the bridge electrode 24 is formed on the island shaped second insulating layer 22; the bridge electrode 24 is connected to the second touch electrode 23 through the through hole formed in the second insulating layer 22.

Figure 7A:
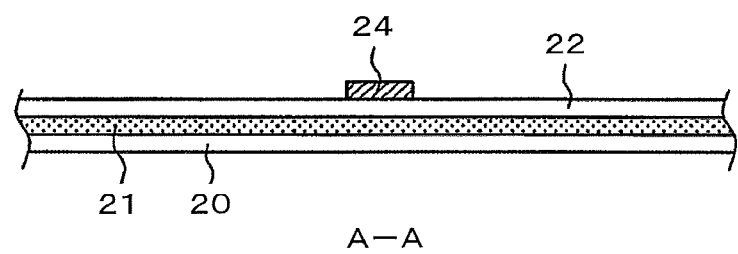
FIG. 7A is another example of cross sectional view at the cross area of the first touch electrode and the second touch electrode along the line A-A of FIG. 5.
Figure 7B:
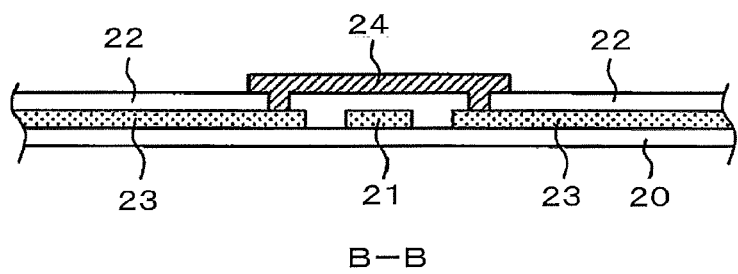
FIG. 7B is another example of cross sectional view at the cross area of the first touch electrode and the second touch electrode along the line B-B of FIG. 5.

FIGS. 7A and 7B are another example of the touch sensor of FIG. 5. FIG. 7A is cross sectional view along the line A-A of FIG. 5; FIG. 7A is cross sectional view along the line B-B of FIG. 5. FIGS. 7A and 7B differ from FIGS. 6A and 6B in that the second insulating layer is formed not only at the cross area but formed on all over the touch sensor. Other structures of FIGS. 7A and 7B are the same as the structure of FIGS. 6A and 6B. In FIGS. 6A, 6B, 7A and 7B, the first touch electrode 21 and the second touch electrode 23 are formed under the second insulating layer 22, and the bridge electrode 24 is formed on the second insulating layer; however, the reverse order is also possible, namely, the first touch electrode 21 and the second touch electrode 23 are formed on the second insulating layer 22, and the bridge electrode 24 is formed under the second insulating layer.

Figure 8:
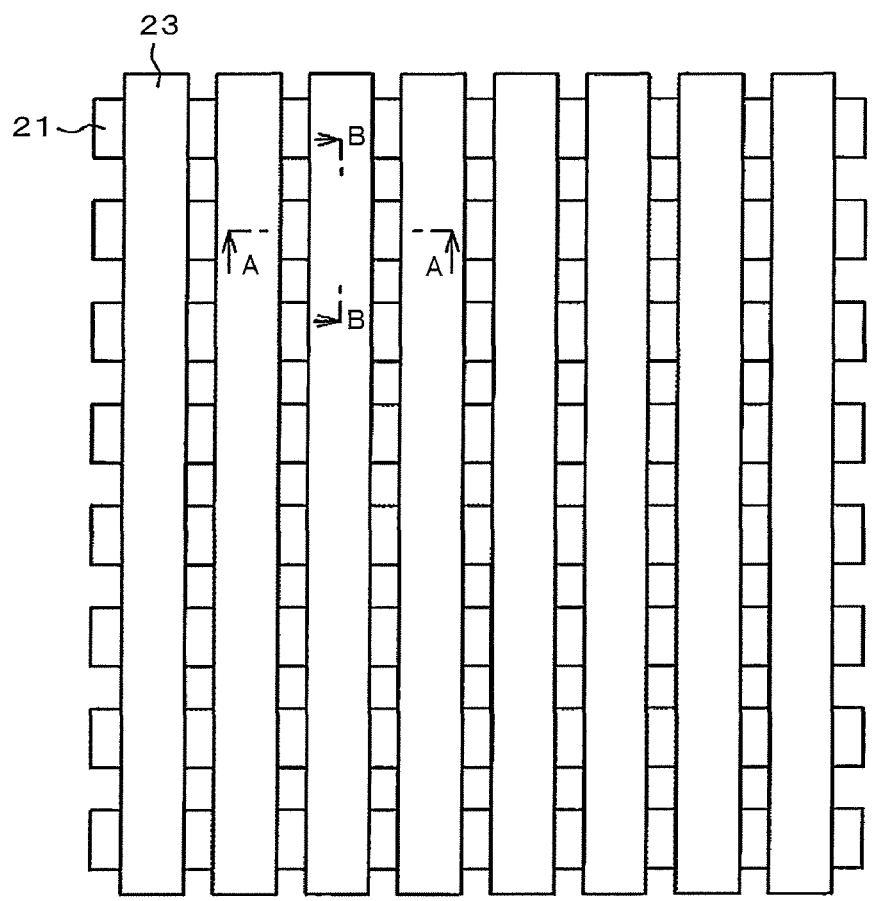
FIG. 8 is a plan view of the electrode structure of the touch sensor of another type.

FIG. 8 is a detailed view of the electrode structure of the touch sensor of another type. In FIG. 8, the stripe shaped plural first touch electrodes 21 extend in lateral direction and arranged in longitudinal direction; the stripe shaped plural second touch electrodes 23 extend in longitudinal direction and arranged in lateral direction. Extending direction of the first touch electrodes 21 and the second touch electrode 23 can be reversed to each other.

Figure 9A:
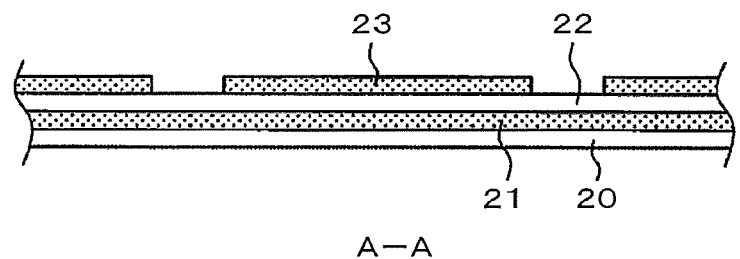
FIG. 9A is an example of cross sectional view at the cross area of the first touch electrode and the second touch electrode along the line A-A of FIG. 8.
Figure 9B:
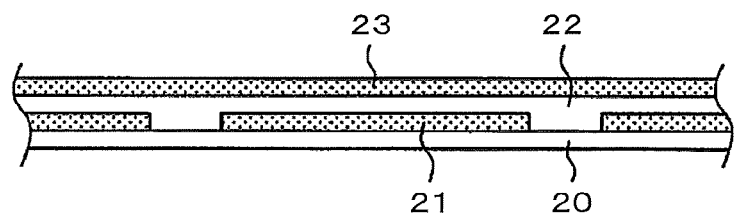
FIG. 9B is an example of cross sectional view at the cross area of the first touch electrode and the second touch electrode along the line B-B of FIG. 8.

FIGS. 9A and 9B are cross sectional views at the cross area of FIG. 8; FIG. 9A is cross sectional view along the line A-A of FIG. 8. In FIG. 9A, the first touch electrode 21 extends in parallel to the paper surface on the first insulating layer 20. The second insulating layer 22 is formed in all over the display area 50 on the first touch electrode; the second touch electrode 23 is formed on the second insulating layer 23 and extends in vertical direction to the paper surface.

FIG. 9B is a cross sectional view along the line B-B of FIG. 9. In FIG. 9, the first touch electrodes 21 extend in vertical direction to the paper surface on the first insulating layer 20. The second insulating layer 22 is formed in all over the display area on the first touch electrode 21; the second touch electrode 23 extends parallel to the paper surface on the second insulating layer 22.

Figure 10:
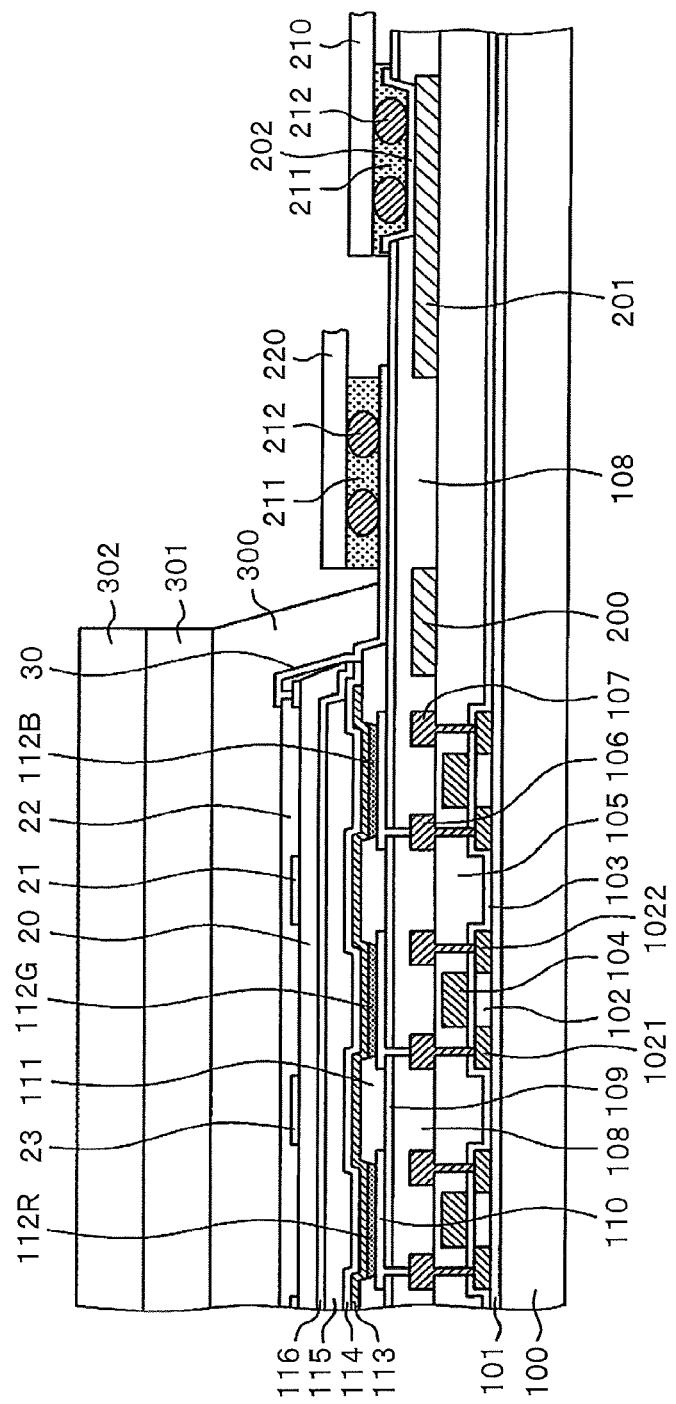
FIG. 10 is a cross sectional view of the organic EL display device having the touch sensor that the present invention is to be applied.

FIG. 10 is a cross sectional view of the organic EL display device having the touch sensor, which the present invention is to be applied, including the terminal area. In FIG. 10, the substrate 100 is formed by glass or resin as e.g. polyimide. If the substrate 100 is made by polyimide, the thickness of the substrate 100 can be as thin as 10 μm-20 μm, thus, a flexible display device is possible. The undercoat 101 is formed on the substrate 100 to prevent the semiconductor layer 102 from being contaminated by impurities from the substrate 100. The undercoat 101 is often formed by three layers of the silicon oxide (herein after SiO), silicon nitride (herein after SiN) and SiO.

The semiconductor layer 102 as an active layer of the TFT is formed on the undercoat 101. The semiconductor layer 102 is Poly-Si formed as follows: initially a-Si is formed by CVD, then, the a-Si is transformed to the Poly-Si. The gate insulating film 103 is formed on the semiconductor layer 102; the gate electrode 104 is formed on the gate insulating film 103.

The ion implantation is applied to the semiconductor layer 102 using the gate electrode 104 as a mask to foist the source portion 1021 and the drain portion 1022. After that, the interlayer insulating film 105 is formed covering the gate electrode 104. The through holes are formed through the interlayer insulating film 105 and the gate insulating film 103 to connect the drain electrode 107 and the drain portion 1022, and to connect the source electrode 107 and the source portion 1021. The organic passivation film 108, which works also as a flattening film, is formed covering the source electrode 106, the drain electrode 107 and the interlayer insulating film 105. The transparent resin as e.g. acrylic is used for the organic passivation film 108.

The capacitive insulating film 109 is formed covering the organic passivation film 108 by e.g. SiN. The capacitive insulating film 109 prevents the organic EL layer 112, which is formed above the capacitive insulating film 109, from being contaminated by impurities like e.g. moisture emitted from the organic passivation film 108. By the way, in many cases, an electrode layer is formed under the capacitive insulating film 109 to form a holing capacitance with the pixel electrode 110, thus, the insulating film 109 is called as the capacitive insulating film; however, the electrode layer under the capacitive insulating film is omitted in FIG. 10.

The pixel electrode 110 is formed on the capacitive insulating film 109. The pixel electrode 110, which is anode, connects with the source electrode 106 via through hole formed in the organic passivation film 108 and the capacitive insulating film 109. By the way, the pixel electrode 110 is a laminated film of a metal oxide conductive film formed by e.g. ITO as an upper layer to form an anode, and a metal or an alloy film as a lower layer to form a reflective electrode.

The organic insulating film of e.g. acrylic is formed covering the capacitive insulating film 109 and the pixel electrode 110; then, the opening is formed in the organic insulating film. The organic insulating film becomes the bank 111 except the opening. The bank 111 covers the step formed by an edge of the pixel electrode 110; thus, the organic EL layer 112 formed in the opening can avoid disconnection due to the step formed by the pixel electrode 110. The bank 111 also has a role to isolate individual pixels.

At this stage, the pixel electrode 110, namely the anode, is exposed in an opening of the bank 111 (the space between the banks 111 in FIG. 10, herein after the opening). On the anodes 110, the red light emitting organic EL layer 112R, the green light emitting organic EL layer 112G, and the blue light emitting organic EL layer 112B are formed. The layers of 112R, 112G and 112B are collectively referred to the organic EL layer 112, herein after. The organic EL layer 112 is formed by plural layers as the hole injection layer, the hole transport layer, the light emitting layer, the electrode transport layer and the electron injection layer. If disconnection occurs in the organic EL layer, a short between the anode 110 and the counter electrode (cathode) 113 occurs. The bank 111 prevents the short.

The cathode 113 is faulted on the organic EL layer 111. The cathode 113 is formed by a transparent electrode of metal oxide conductive film as e.g. ITO or IZO, or by a thin metal film or an alloy film. The cathode is formed in common in plural pixels, namely, formed on the bank 111, too. At this stage, the pixel can emit light if voltage is applied.

The organic EL layer 112 is, however, weak to moisture and mechanically weak because it is thin. Therefore, the protective film is formed covering the cathode 113. Generally, the protective film is a laminated film of an organic film and an inorganic film. In FIG. 10, the protective layer is formed by three layers comprising: the first protective film 114, which is an inorganic film of e.g. SiN; the second protective film 115, which is an organic film of e.g. acrylic; the third protective film 116, which is an inorganic film of e.g. SiN.

In FIG. 10, the first insulating layer 20 is formed on the third protective film 116 as a under layer for the touch sensor. The first insulating layer 20 can be made by organic substance like e.g. polyimide or acrylic, or by inorganic substance like SiN. Further, the third protective film 116 can work as the first insulating layer 20 to avoid forming an extra layer.

The first touch electrode 21 and the second touch electrode 23 are formed on the first insulating layer 20. Since both the first touch electrode 21 and second touch electrode 23 are formed on the first insulating layer 20 in FIG. 10, the electrode structure of FIG. 10 corresponds to the touch sensor electrode structure explained at FIGS. 5 to 7. In FIG. 10, the second insulating layer 22 is formed covering the first touch electrode 21 and the second touch electrode 23. The lead wiring 30 for the first touch electrode 21 and the second touch electrode 23 is on the same layer as the bridge electrode 24, which was explained at FIGS. 5 to 7.

After that, the circular polarizing plate 301 and the cover film 302 are adhered to the touch sensor by the adhesive 300. The adhesive 300 has also a role as a protective film for the touch sensor. The circular polarizing plate 301 suppresses the reflection of external light so that the contrast is not deteriorated. The cover film 302 protects whole of the organic EL display device having the touch sensor.

In the terminal area 150, the terminal wiring 201, which is for input and output of signals or powers to the organic EL display device, and the touch sensor terminal wiring, which is connected with touch electrodes by lead wiring 30, are formed. The main flexible wiring substrate 210 is connected to the terminal wiring 201, the touch sensor flexible wiring substrate 220 is connected to the lead wiring 30. In FIG. 10, the lead wiring 30 connects the touch sensor flexible wiring substrate 220 at the place beyond the edges of the first protective film 114, the second protective film 115 and the third protective film 116. In this structure, however, has a possibility of step disconnection at the edges of the first protective film 114 and the third protective film 116. That disconnection can be avoided by extending the first protective film 114 and the third protective film 116 under the lead wiring 30 so that the lead wiring 30 does not cross over the edges of the first protective film 114 and the third protective film 116.

Figure 11:
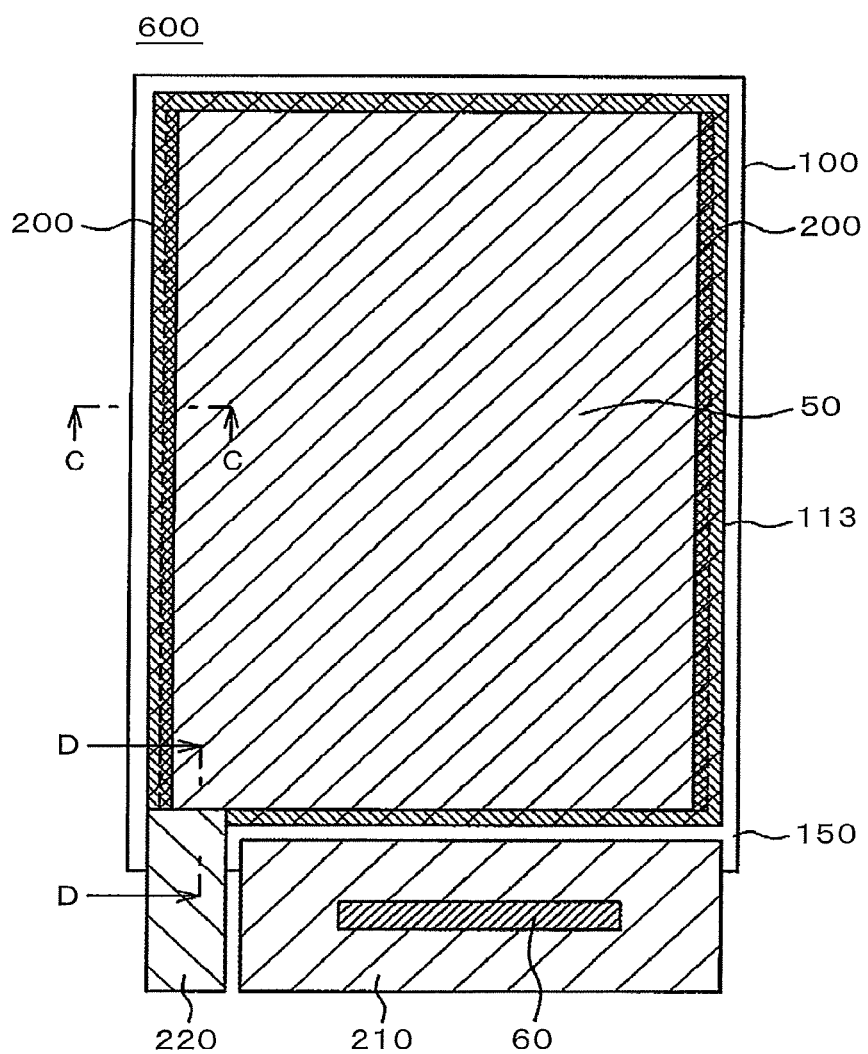
FIG. 11 is a plan view of the organic EL display device that shows the feature of the first embodiment.

FIG. 11 is a plan view of the organic EL display device that shows the feature of the first embodiment. FIG. 11 is a plan view that shows the area where the cathode 113 is formed in the organic EL display panel. The scanning line driving circuits 200 are located at both sides of the display area 50. Since the lead lines from the scanning line driving circuit 200 extend to the terminal area 150, pulses of e.g. gate voltages generated in the scanning line driving circuit 200 are emitted from the lead lines; this becomes noises to the touch sensor. In this specification, lead lines from the scanning line driving circuit are also defined to be included in the scanning line driving circuit.

In FIG. 11, the cathode 113 is formed beyond the display area 50 to cover the peripheral driving circuit 200 like e.g. scanning line driving circuit and leads connecting to the driving circuit 200. Thus, it is possible for the touch sensor to avoid the noise generated by the peripheral circuit 200. Other structures of FIG. 11 are the same as explained at e.g. FIG. 3.

Figure 12:
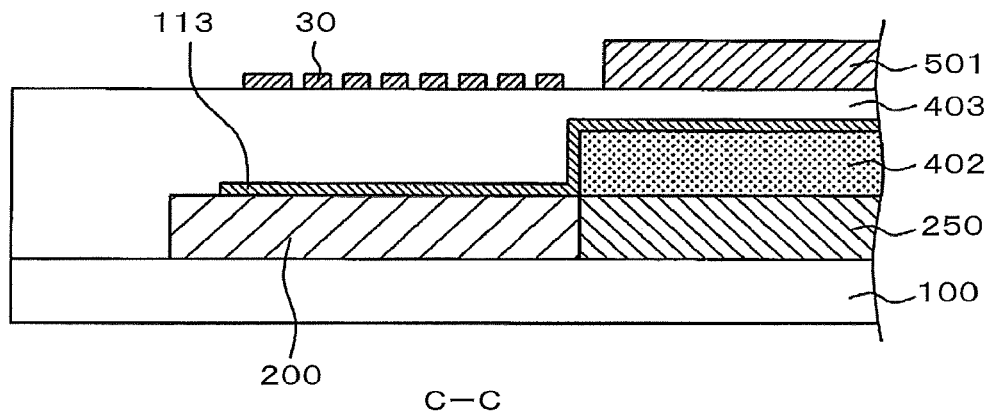
FIG. 12 is cross sectional view along the line C-C of FIG. 11.

FIG. 12 is cross sectional view along the line C-C of FIG. 11. FIG. 12 is a cross sectional view expressed by blocks of elements for easy understanding of the invention. In FIG. 12, the pixel circuit 250 is formed at the area corresponding to the display area 50. The pixel circuit 250 includes the TFTs formed in the pixels, the wirings between the TFTs, the scanning lines and the video signal lines, etc. The peripheral circuit 200 is formed outside of the pixel circuit 250.

In FIG. 12, the organic EL layer 402 is formed on the pixel circuit 250. The cathode 113 is formed on the organic EL layer 402. The feature of FIG. 12 is that the cathode 113 not only covers the organic EL layer 402 but also covers the peripheral circuit 200. The seal layer 403 is formed over the cathode 113. The seal layer 403 includes e.g. the first protective film 114, the second protective film 115, the third protective film 116, and the first insulating layer 20, which are depicted in FIG. 10. The touch electrode 501 for the touch sensor is formed on the seal layer 403. The touch electrode 501 is formed in the display area; the lead wirings 30 from the touch sensor extend to above the peripheral circuit 200 of the organic EL display device. In FIG. 12, the bridge electrode 24, etc. are omitted in the touch electrode 501; however, the layer structure of the touch electrode 501 is the same as explained in FIGS. 5 to 7. The lead wiring 30 is formed by the upper layer among the touch electrodes 501 or bridge electrodes 24.

As depicted in FIG. 12, the cathode 113 exists between the peripheral circuit 200 and the lead wirings 30 of the touch sensor, thus noise from the peripheral circuit 200 is shielded by the cathode 113. Therefore, the noise from the peripheral circuit 200 is prevented from intruding in the lead wirings 30 of the touch sensor; consequently, a malfunction of the touch sensor can be avoided.

Figure 13:
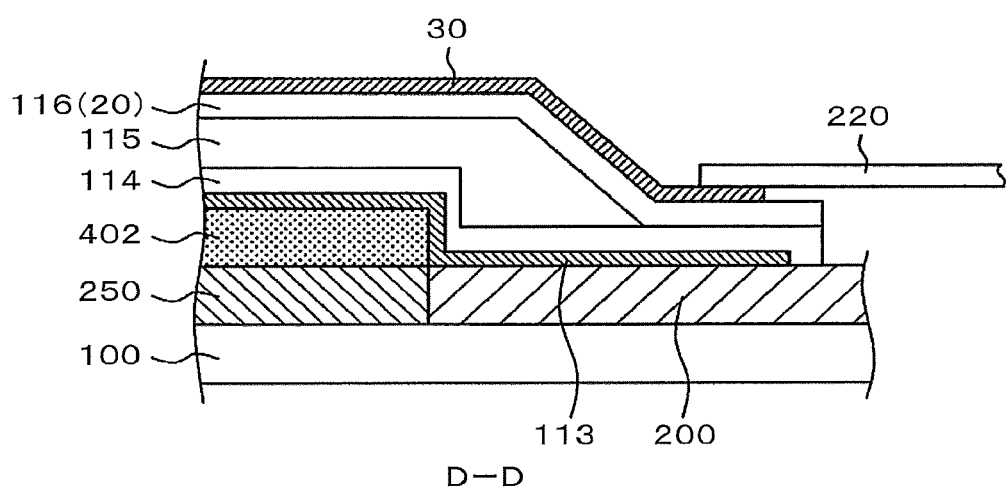
FIG. 13 is cross sectional view along the line D-D of FIG. 11.

FIG. 13 is cross sectional view along the line D-D of FIG. 11. FIG. 13 is also a cross sectional view expressed by blocks of elements for easy understanding of the invention. In FIG. 13, the pixel circuit 250 is formed on the substrate 100; the peripheral circuit 200 is formed outside of the pixel circuit 250; the organic EL layer 402 is formed on the pixel circuit 250 like the structure of FIG. 12.

In FIG. 13, the cathode 113 covers not only the display area but also the peripheral circuit 200. In the display area, namely on the pixel circuit 250, three layers of: the first protective film 114 formed by inorganic substance as e.g. SiN, the second protective film 115 formed by organic substance and the third protective film 116 formed by inorganic substance as e.g. SiN are formed on the cathode 113. The three layers correspond to the seal layer 403 of FIG. 12.

In FIG. 13, the lead wiring 30 extends on the third protective film 116 and over the peripheral circuit 200; the lead wiring 30 connects with the touch sensor flexible wiring substrate 220 on the third protective film 116. By the way, in the example of FIG. 13, the third protective film also works as the first insulating layer of the touch sensor. The second protective film 115, which is formed by the organic substance, doesn't exist at the place where the touch sensor flexible wiring substrate 220 connects to make the connecting process of the touch sensor flexible wiring substrate 220 simpler.

The feature of FIG. 13 is that the cathode 113 is formed covering the peripheral circuit 200. In other words, the cathode 113 exists between the lead wiring 30 from the touch sensor and the peripheral circuit 200. The cathode 113 works as a shield to prevent the noise generated by the peripheral circuit 200 from intruding in the lead wiring 30, which causes a malfunction of the touch sensor.

As described above, the present invention forms a cathode 113 between the peripheral circuit 200 and the lead wring 30 from the touch sensor; thus, the malfunction of the touch sensor due to the noise generated by the peripheral circuit can be avoided. In the present invention, the cathode 113 has to exist between the peripheral circuit 200 and the lead wiring 30 from the touch sensor; therefore, the cathode 113 doesn't need to cover all the area of the peripheral circuit 200; however, it is preferable the cathode 113 covers all the area of the peripheral circuit 200 for a better shield against the noise from the peripheral circuit 200.

Second Embodiment

Figure 14:
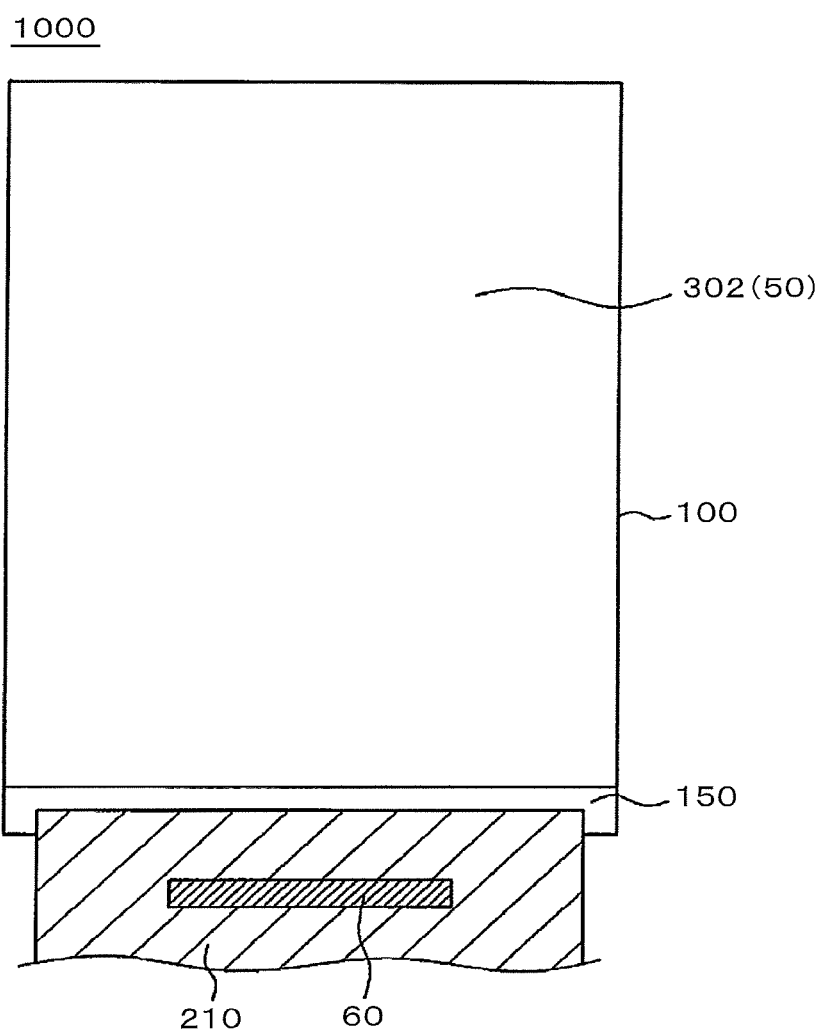
FIG. 14 is a plan view of the organic EL display 1000 according to the second embodiment.

FIG. 14 is a plan view of the organic EL display device 1000 that the second embodiment is applied. FIG. 14 differs from FIG. 1 in that input and output of signals to the touch sensor is not made through the touch sensor flexible wiring substrate, but is made through the main flexible wiring substrate 210. For that purpose, the lead wiring 30 from the touch sensor must extends to the terminal area 150; thus the lead wiring 30 of the touch sensor has more chance to get the noise from the peripheral circuit 200. Other feature of FIG. 15 is the same as FIG. 1.

Figure 15:
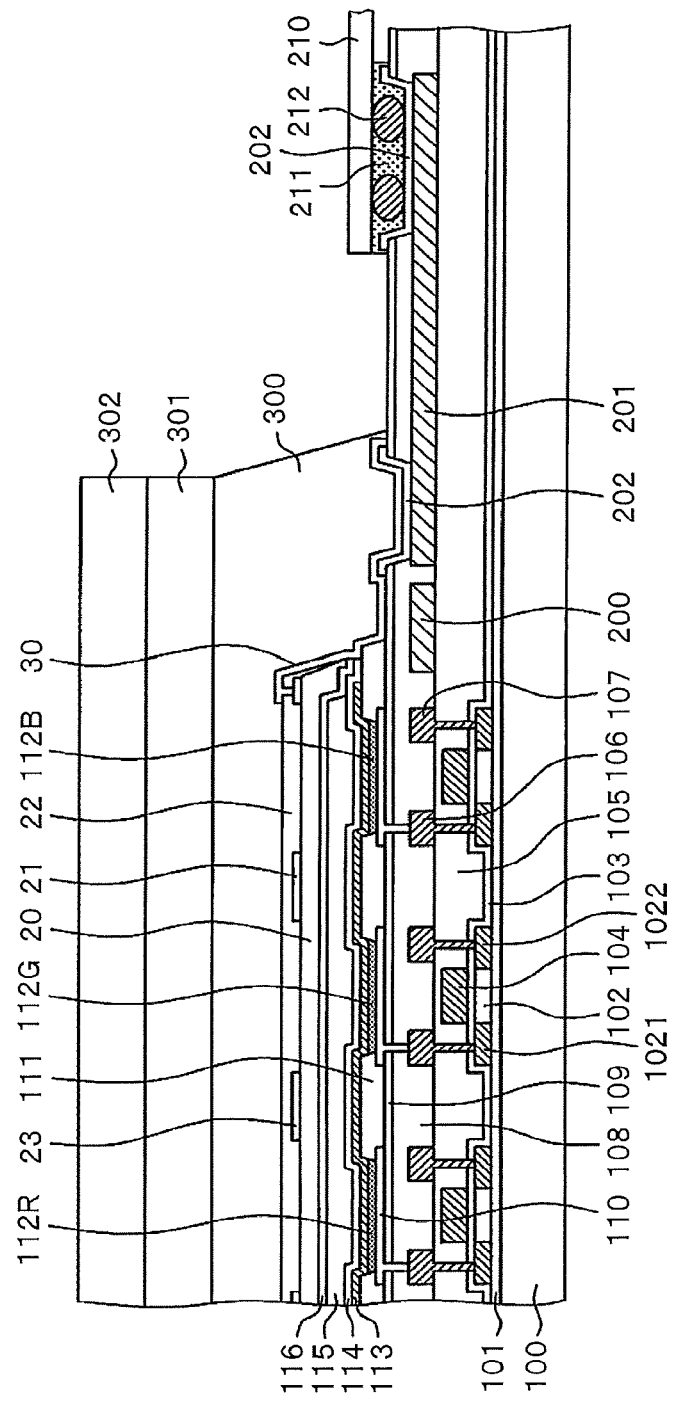
FIG. 15 is a cross sectional view of the organic EL display device having a touch sensor including the terminal area that the second embodiment is to be applied.

FIG. 15 is a cross sectional view of the organic EL display device having a touch sensor including the terminal area that the second embodiment is to be applied. FIG. 15 differs from FIG. 10 in that the lead wiring 30 from the touch sensor connects with the terminal wring 201 that is formed on the display panel. The terminal wiring 201 connects with the main flexible wiring substrate 210 at the first terminal; signals for the touch panel sensor is input and output through the main flexible wiring substrate 210. The terminal wiring 201 is not a single wiring but a general term for plural wirings.

The structure of the second terminal, which connects the lead wiring 30 through the terminal wiring 201, is the same as the structure of the first terminal for the main flexible wiring substrate 210; thus, the same bonding process can be applicable. The second terminal in FIG. 15 is covered by the adhesive 300, which also works as a protective film.

Other structure of FIG. 15 is the same as FIG. 10. In the structure of FIG. 15, too, the lead wirings 30 of the touch sensor extend over the peripheral circuit 200 via the organic passivation film 108 and the capacitive insulating film 109. Thus, the noise from the peripheral circuit 200 intrudes in the lead wiring 30 from the touch panel; thus, a malfunction of the touch panel occurs.

Figure 16:
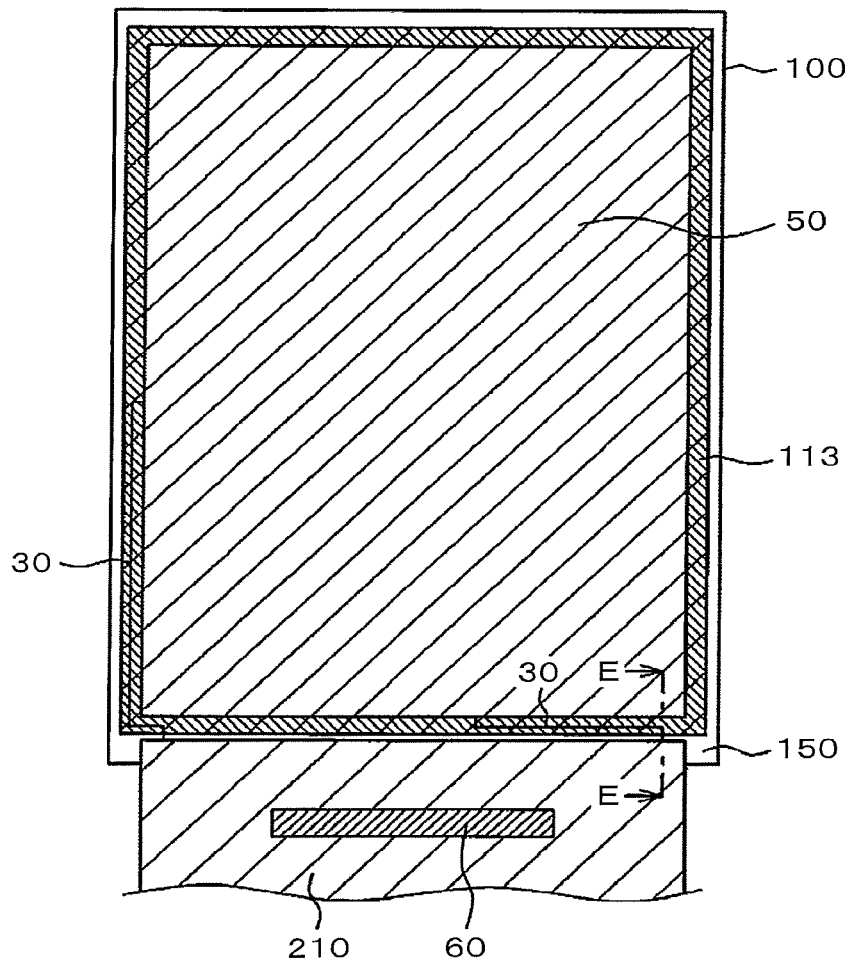
FIG. 16 is a plan view of the first example of the second embodiment.

FIG. 16 is a plan view of the first example of the second embodiment. In FIG. 16, too, the cathode 113 extends beyond the display area 50. FIG. 16 is the same as FIG. 11 except that the touch sensor flexible wiring substrate 220 doesn't exist, but only the main flexible wiring substrate 210 is connected to the terminal area 150. In FIG. 16, however, the wiring lead 30 of the touch sensor is described. FIG. 16 omits the peripheral circuit 200 to avoid a complexity of the figure. FIG. 16 differs from the first embodiment in that the lead wirings 30 from the touch electrodes extend longer in FIG. 16 to connect with the main flexible wiring substrate 210.

Figure 17:
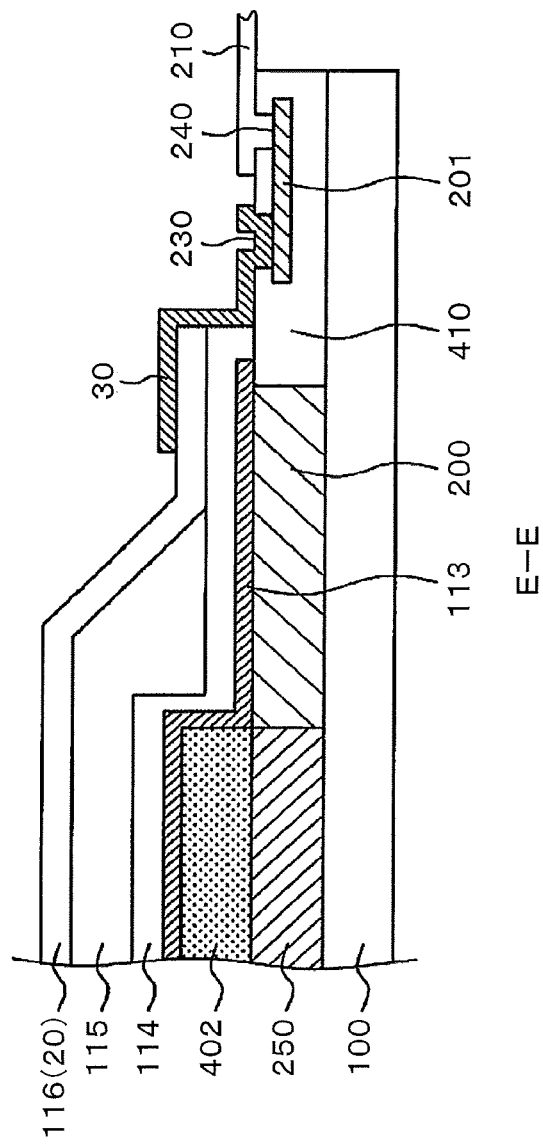
FIG. 17 is a cross sectional view along the line E-E of FIG. 16.

FIG. 17 is a cross sectional view along the line E-E of FIG. 16. FIG. 17 differs from FIG. 13 of the first embodiment in that the lead wiring 30 from the touch panel extends beyond the area where the cathode 113 is formed to connect with the terminal wiring 201. The feature of the FIG. 17 is that the peripheral circuit 200 is not formed in the area where the cathode 113 is not formed even if the lead wirings 30 of the touch sensor extend beyond the cathode 113. Thus, structure of FIG. 17 can avoid a malfunction of the touch sensor due to the noise from the peripheral circuit 200.

Figure 18:
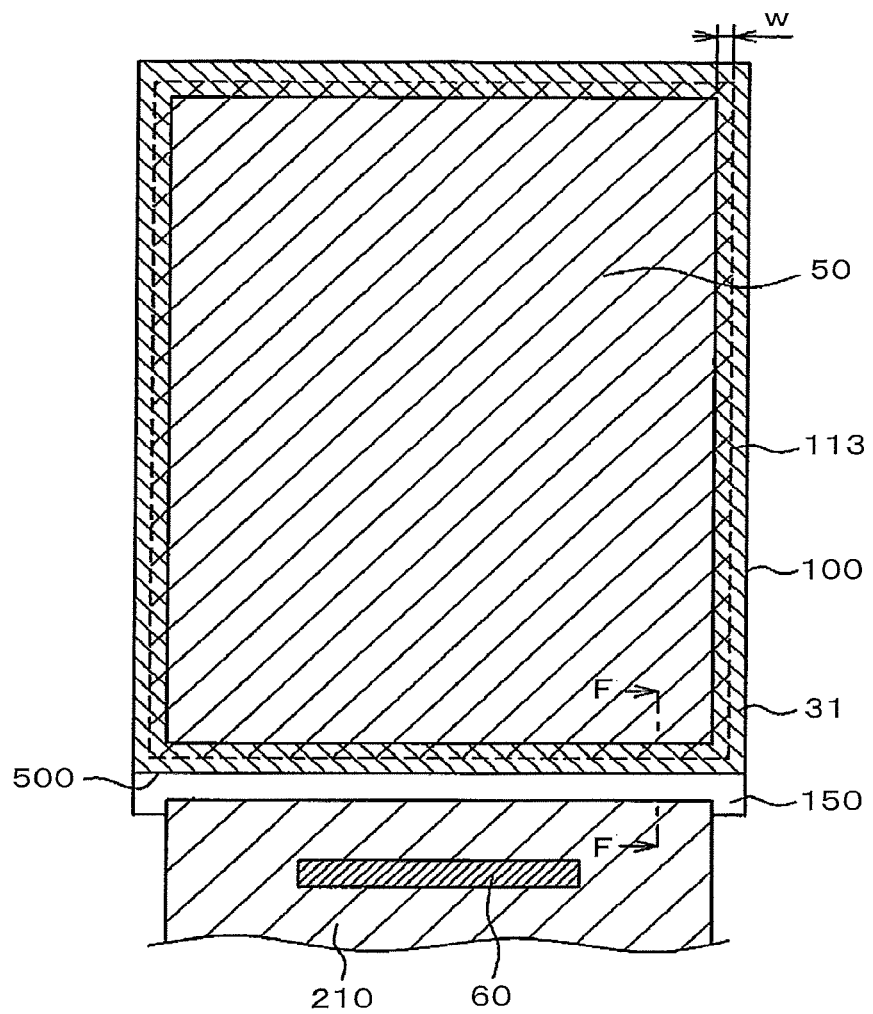
FIG. 18 is a plan view of the second example of the second embodiment of the present invention.

FIG. 18 is a plan view of the second example of the second embodiment of the present invention. The feature of FIG. 18 is that the shield wiring 31 for the shield is formed at the periphery of the touch sensor 500. The shield wiring 31 is formed on the same layer as the first touch electrode 21, which is formed on the first insulating layer 20, and is formed by the same material as the first touch electrode 21. A constant voltage like cathode voltage is applied to the shield wiring 31.

In FIG. 18, the shield wiring 31 is formed up to the edge of the touch sensor 500. The shield wiring 31 can be used as the shield if the cathode 113 cannot be formed to thoroughly cover the peripheral circuit 200 due to a requirement of layout. In FIG. 18, the shield wiring 31 partially overlaps the cathode 113 in a plan view. The overlap amount w is the same or bigger than the mask misalignment between the shield wiring 31 and the cathode 113 formed on the touch sensor.

Figure 19:
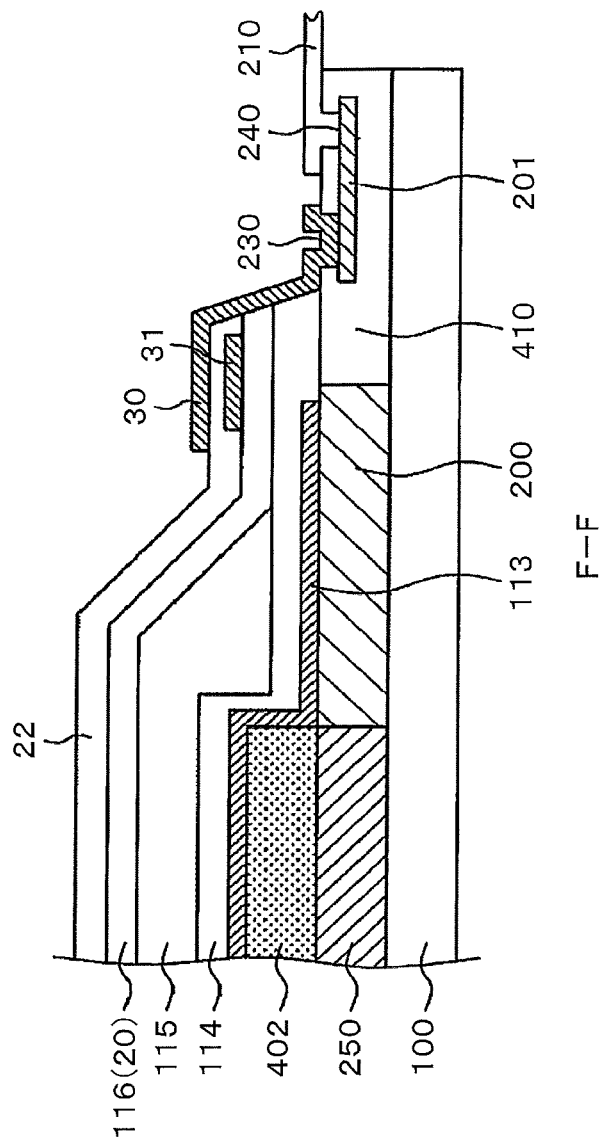
FIG. 19 is cross sectional view along the line F-F of FIG. 18.

FIG. 19 is cross sectional view along the line F-F of FIG. 18. In FIG. 19, too, the third protective film 116 works also as the first insulating layer 20 of the touch sensor. The shield wiring 31 is formed on the first insulating layer 20 (the third protective film 116) at the periphery of the touch sensor. In FIG. 19, the peripheral circuit 200 is formed up to the outside of the cathode 113. This area, however, covered and shielded by the shield wiring 31, thus, the wiring leads 30 is shielded from the noise generated by the peripheral circuit 200. Other structures of FIG. 19 are the same as the structure of FIG. 17.

In FIG. 18, the shield wiring 31 is formed in all around the touch sensor; however, it is not necessarily made in all around the touch sensor. For example, at the side adjacent to the terminal area 150, the lead wirings 30 need to extend to the terminal area of the organic EL display panel, thus, there is a high possibility that the lead wirings 30 extend over the peripheral circuit 200 that is not covered by the cathode 113. Therefore, it is possible or reasonable to form the shield wiring 31 only at the side of the touch sensor adjacent to the terminal area 150 of the organic EL display panel. In this case, on the other sides of the touch sensor 500, the peripheral circuit can be covered by the cathode 113 as explained in the first embodiment.

What is claimed is:

1. A display device comprising:
   a substrate, a display area where plural pixels are formed in a matrix form on the substrate, a driving circuit formed in a peripheral area outside of the display area, a touch sensor, overlapping the display area, having a first touch electrode extending in a first direction and a second touch electrode extending in a second direction that crosses the first direction, a first flexible wiring substrate to input and output signals to the driving circuit, a second flexible wiring substrate to input and output signals to the touch sensor, wherein each of the plural pixels has a pixel electrode layer, a counter electrode layer over the pixel electrode layer, a display element layer formed between the pixel electrode layer and the counter electrode layer, the touch sensor is formed over the counter electrode via an insulating layer, lead wirings from the first touch electrode or from the second touch electrode extend to an area that overlaps the driving circuit formed in the peripheral area, the counter electrode layer extends to cover the area that the lead wirings and the driving circuit overlap to each other in the peripheral area, the first flexible wiring substrate connects with first terminals without overlapping with the counter electrode layer in the peripheral area, and the second flexible wiring substrate connects with second terminals with overlapping with the counter electrode layer in the peripheral area.

2. The display device according to claim 1, wherein the insulating layer comprising, a first protective film including silicon or nitride, a second protective film including an organic substance, a third protective layer including silicon or nitride, the first protective film and the second protective film has an overlapping area outside of the second protective film, the lead wirings electrically connect with the second terminals, the second flexible wiring substrate connects with the second terminals at the overlapping area of the first protective film and the third protective film.

3. A display device comprising:

a substrate, a display area where plural pixels are formed in a matrix form on the substrate, a driving circuit formed in a peripheral area outside of the display area, a touch sensor, overlapping the display area, having a first touch electrode extending in a first direction and a second touch electrode extending in a second direction that crosses the first direction, a first flexible wiring substrate to input and output signals to the driving circuit, a second flexible wiring substrate to input and output signals to the touch sensor, wherein each of the plural pixels has a pixel electrode layer, a counter electrode layer over the pixel electrode layer, a display element layer formed between the pixel electrode layer and the counter electrode layer, the touch sensor is formed over the counter electrode via an insulating layer, lead wirings from the first touch electrode or from the second touch electrode extend to an area that overlaps the driving circuit formed in the peripheral area, the counter electrode layer extends to cover the area that the lead wirings and the driving circuit overlap to each other in the peripheral area, the first flexible wiring substrate connects with first terminals without overlapping with the counter electrode layer in the peripheral area, the second flexible wiring substrate connects with second terminals without overlapping with the counter electrode layer in the peripheral area.

4. The display device according to claim 3, wherein the insulating layer comprising, a first protective film including silicon or nitride, a second protective film including an organic substance, a third protective layer including silicon or nitride, the first protective film and the second protective film has an overlapping area outside of the second protective film, the lead wirings electrically connect with the second terminals, the second flexible wiring substrate connects with the second terminals at the overlapping area of the first protective film and the third protective film.

5. A display device comprising:

a substrate, a display area where plural pixels are formed in a matrix form on the substrate, a driving circuit formed in a peripheral area outside of the display area, a touch sensor, overlapping the display area, having a first touch electrode extending in a first direction and a second touch electrode extending in a second direction that crosses the first direction, wherein each of the plural pixels has a pixel electrode layer, a counter electrode layer over the pixel electrode layer, a display element layer formed between the pixel electrode layer and the counter electrode layer, the touch sensor is formed over the counter electrode via an insulating layer, lead wirings from the first touch electrode or from the second touch electrode extend to an area that overlaps the driving circuit formed in the peripheral area, the counter electrode layer extends to cover the area that the lead wirings and the driving circuit overlap to each other in the peripheral area, the first touch electrode and the second touch electrode are formed either by a first electrode layer that is formed on the insulating layer or by a second electrode layer that is formed on a second insulating layer formed above the first electrode layer, the first electrode layer extends to cover an area where the lead wirings and the driving circuit overlap without overlapping with the counter electrode.

* * * * *